United States Patent [19]

Towne et al.

[11] Patent Number: 5,389,889

[45] Date of Patent: Feb. 14, 1995

[54] TEMPERATURE-COMPENSATED CURRENT SOURCE FOR USE IN A HALL ANALOG MAGNETIC-FIELD DETECTOR

[75] Inventors: Jay M. Towne, Henniker; Ravi Vig, Concord; Paul W. Latham, II, Lee, all of N.H.

[73] Assignee: Allegro Microsystems, Inc., Worcester, Mass.

[21] Appl. No.: 119,851

[22] Filed: Sep. 10, 1993

[51] Int. Cl.⁶ .............................................. H03F 15/00
[52] U.S. Cl. ........................................ 330/6; 330/289; 327/513; 327/511
[58] Field of Search ............................. 307/309, 310; 324/117.1.4; 330/6, 252, 289

[56] References Cited

U.S. PATENT DOCUMENTS 4,465,976  8/1994  Avery .................................. 324/251
5,260,614 11/1993  Theus et al. ...................... 307/309 X

OTHER PUBLICATIONS

Hall Transducer Circuit With Voltage and Current Regulation, R. J. Braun and W. S. Ebert, IBM Technical Disclosure Bulletin vol. 17 No. 11, Apr. 1975, pp. 3232-3233.

Primary Examiner—Steven Mottola

[57] ABSTRACT

A temperature-compensated current source energizes a Hall element. The current source includes a voltage divider across the DC voltage supply busses and a differential amplifier arranged as a voltage follower which develops the output voltage across a reference resistor, creating a reference current which is amplified to generate a Hall energizing current. This results in a Hall element gain which is controllable over temperature. The temperature coefficient of the resistor can be chosen to compensate for the sensitivity temperature coefficient of a Hall element powered by a constant current source. Additionally, the temperature coefficient of the resistor may be chosen to compensate for the temperature coefficient of a magnet used to generate the magnetic field which the Hall element is intended to detect. The magnitude of the Hall current, and thus the Hall element gain, is directly proportional to the magnitude of the DC voltage supply. A trimmable current amplifier is used to compensate for the effects of manufacturing tolerances on the magnitude of the Hall current.

12 Claims, 2 Drawing Sheets

TEMPERATURE-COMPENSATED CURRENT SOURCE FOR USE IN A HALL ANALOG MAGNETIC-FIELD DETECTOR

BACKGROUND

This invention relates to a temperature-compensated current source for energizing a Hall element in an analog magnetic-field detector, and more particularly to such a current source that produces a Hall-energizing current which changes proportionally with the circuit energizing DC voltage.

It is known to use a current source to energize a Hall element which has been recognized as providing greater stability of Hall element gain (the Hall-output-voltage per unit magnetic-field) with changes in temperature than does the more commonly used DC voltage source for energizing the Hall element. This is understood to be true because the resistivity of the Hall element body typically has a large temperature coefficient whereby with a constant energizing voltage the Hall output voltage produced is always proportional to the resulting Hall energizing current. However, even with a constant current-source energizing current in a Hall element, the Hall output voltage produced in response to a given level of ambient magnetic field is known to vary over temperature by some amount. Thus with constant current excitation, the Hall output voltage is still subject to changes with temperature.

It is an object of this invention to provide a Hall energizing current source capable of compensating for the variations of the Hall output voltage with temperature.

It is a further object of this invention to provide a Hall energizing current source wherein for the situation that the DC supply voltage (Vcc) changes, the Hall energizing current will change proportionally. The Hall element gain will consequently be proportional to the magnitude of the DC supply voltage.

It is a further object of this invention to provide a means of adjusting the Hall energizing current without affecting the temperature coefficient of that same Hall energizing current.

SUMMARY OF THE INVENTION

A temperature-compensated current source for use in a Hall magnetic-field detector includes a differential amplifier means, and a current amplifier whose input current is generated as an output of the differential amplifier. The output of the current amplifier is intended to be connected to a Hall element, which is energized by this current source. The differential amplifier is connected as a voltage follower and includes a reference resistor, and the differential amplifier is additionally for varying the current-source current as a function of the temperature coefficient of resistance (TCR) of the reference resistor to compensate for the variation with temperature of the Hall sensitivity of the Hall element that may be connected to and energized by the current source. The reference resistor may in addition have a TCR that simultaneously compensates for the characteristic variation with temperature in field strength of a magnet that may be used to generate the magnetic field to be detected by the magnetic-field detector.

The current source has a pair of DC voltage terminals to which a DC voltage may be connected for energizing the current source. The differential amplifier is additionally for changing the level of the current-source current as a direct function of the DC energizing voltage that may be applied to the DC voltage terminals. For example, a pair of series connected voltage-divider resistors may be connected across the DC voltage terminals. The junction of the voltage-divider resistors is connected to the input of the differential amplifier means, for effecting the change in level of the current-source current as a direct function of the DC energizing voltage.

The current source may also have a current amplifier consisting of a second differential amplifier connected as a voltage follower, with two resistors having the same TCR but different resistance values, the current gain being the ratio of these two resistors. The output current of this current amplifier is the Hall energizing current. The Hall energizing current is therefore adjustable by actively trimming the value of one of these two resistors.

DESCRIPTION OF THE PREFERRED EMBODIMENT

Figure 1:
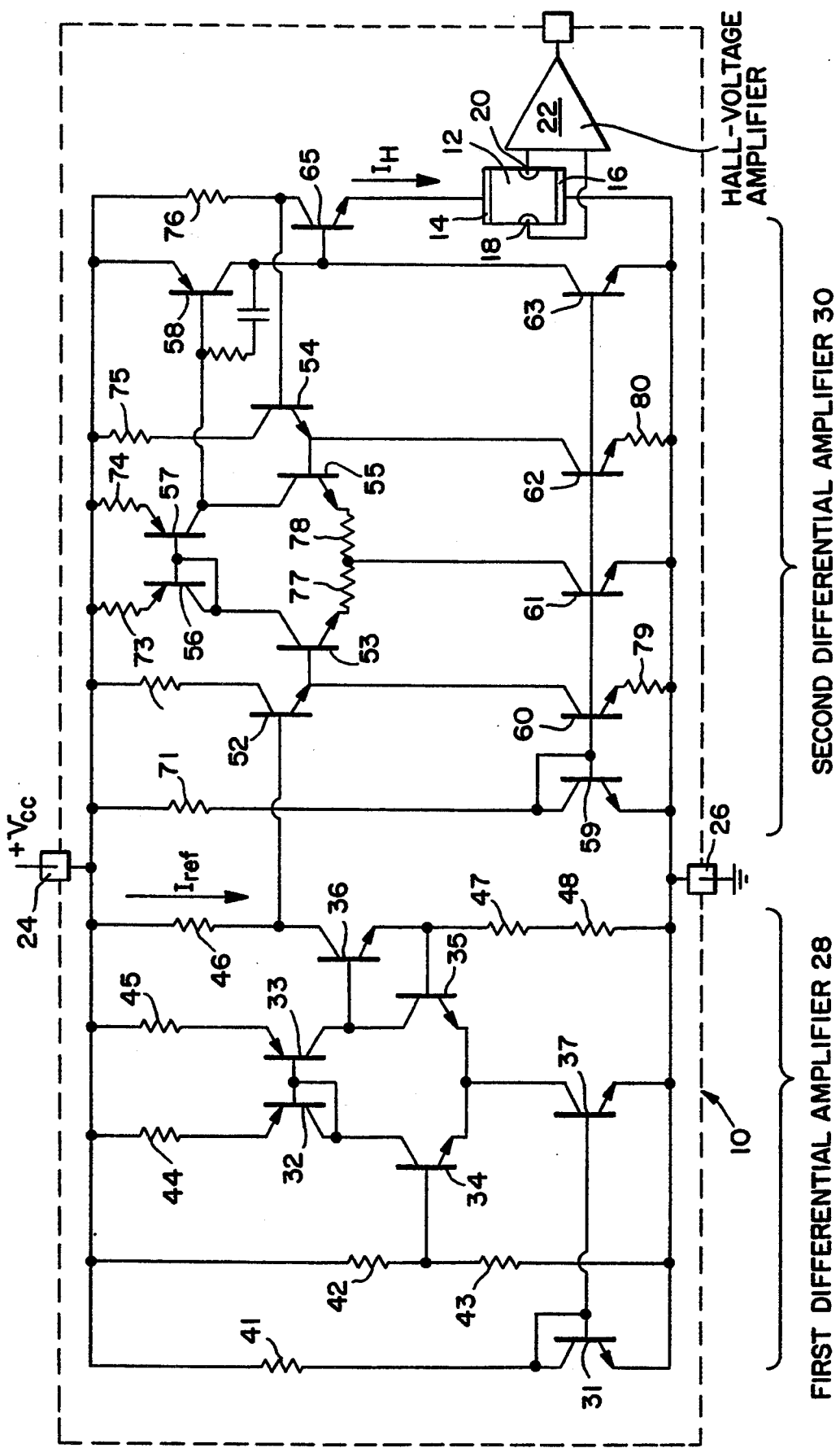
FIG. 1 shows a circuit diagram of the preferred current source of this invention connected to a Hall element.

Referring to the FIG. 1, a silicon integrated circuit 10 includes a Hall element 12 having two power terminals 14 and 16 and two output terminals 18 and 20. Integrated circuit 10 also includes the Hall energizing current source, namely all of the circuitry shown except the Hall element 12 and the Hall-voltage amplifier 22.

The current source is energized from a DC voltage source (not shown) via two voltage energizing terminals 24 and 26. It includes first and second differential amplifiers 28 and 30.

Amplifier 28 includes transistors 31, 32, 33, 34, 35, 36 and 37, as well as resistors 41, 42, 43, 44, 45, 46 and 47. The bases of transistors 34 and 35 serve as the differential input of amplifier 28, which is connected as a voltage follower. The feedback provided by transistor 36 insures that the voltage at the input at transistor base 35 is essentially always equal to that at the base of transistor 34, and to the voltage dropped across resistor 47. Thus the "reference" current, Iref, flowing through the resistor 46 is the current established through "reference" resistor 47, neglecting the relatively small base currents of transistors 35, 36 and 52. Iref can therefore be described as the voltage at the base of transistor 35 (V35Base), divided by the resistance R47 of resistor 47, or:

$$\frac{(V35Base)}{R47} \qquad \text{Equation 1}$$

The temperature coefficient of Iref will therefore depend on the TCR of R47, which can be chosen in such a manner that R47's TCR will cancel the temperature coefficient of the Hall element gain when driven with a constant current source. Resistor 47 may be a single resistor or a series, parallel, or series/parallel combination of resistors with different TCRs to achieve a current with many possible TCRs.

In an analog magnetic-field detector circuit it is desirable to be able to set the Hall current $I_H$ at a value proportional to Vcc. This circuit accomplishes this in the following manner.

The voltage at the base of transistor 34 is proportional to the value of Vcc, because of the resistor-divider comprised of R42 and R43. Since the voltage at the base of transistor 35 is equal to the voltage at the base of transistor 34, then the current Iref must be proportional to Vcc (from Equation 1). The Hall energizing current will be shown to be proportional to Iref, by the action of the second differential amplifier 30.

The second differential amplifier 30 includes transistors 52, 53, 54, 55, 56, 57, 58, 59, 60, 61, 62, 63, and 65 as well as resistors 71, 72, 73, 74, 75, 76, 77, 78, 79 and 80. The second differential amplifier 30 is connected as a current amplifier.

The current $I_H$ from the second amplifier 30 energizes the Hall element 12. As is the first amplifier 28, the second amplifier 30 is also arranged as a voltage follower. The bases of transistors 52 and 54 serve as the differential inputs of amplifier 30. The voltage appearing at the second amplifier input at the base of transistor 52 is forced to appear at the other amplifier input at the base of transistor 54. Neglecting base currents, the current $I_H$ through the Hall element can be expressed as $$\frac{(Iref \times R46)}{R76} \qquad \text{Equation 2}$$

Thus $I_H$ is proportional to Iref by a resistor ratio. It is preferred that these two resistors, R46 and R76, have the same TCR. The output current of this current amplifier can thus be easily adjusted by trimming resistor R46. Trimming this resistor in no way affects the temperature performance of the circuit. Transistor 65 allows the voltage across the Hall element to vary as the resistance of the Hall element changes over temperature. The voltage at the emitter of transistor 65 is equal to the product of $I_H$ times the Hall element resistance. The voltage at the collector of transistor 65 is equal to the product of $I_H$ times R76. Transistor 65 allows these voltages to vary over temperature without significantly affecting $I_H$.

The current-reference resistor 47 may be of a TCR that provides a current-source current with a temperature characteristic that compensates that of a magnet to be used for generating the magnetic field in an analog magnet-displacement detector. Furthermore, either R46 or R47 may be a discrete resistor external to the integrated circuit for making needed adjustment in Hall current and/or the Hall-current temperature characteristic for one of many possible magnetic field detecting applications.

Figure 2:
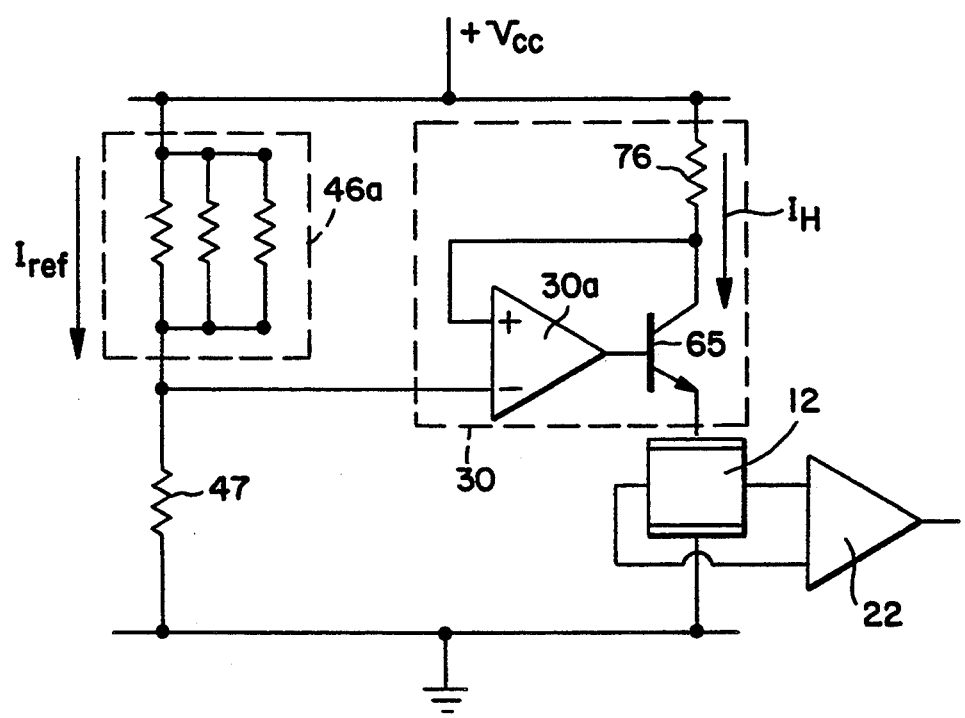
FIG. 2 shows an elementary current source of this invention connected to a Hall element.

The circuit of FIG. 2 is a different representation of the circuit of FIG. 1, except that a simple voltage divider circuit composed of the reference resistor 46a and the other voltage-divider resistor 47, is substituted for the more versatile first differential amplifier 28 of FIG. 1. In FIG. 2, the differential amplifier 30a with the current amplifier transistor 65 and the Hall current sensing resistor 76 are seen to form a conventional voltage follower circuit 30, connected in the same way as in FIG. 1 whereby the voltage across the sensing resistor 76 is made equal to the voltage across the reference resistor 46, which is shown in FIG. 2 as a trimmable reference resistor 46a.

We claim:

1. A temperature-compensated current source for use in a Hall magnetic-field detector comprising a pair of DC voltage terminals to which a DC supply voltage may be connected for energizing said current source, a current-source output; a differential amplifier means; a reference resistor connected to one input of said differential amplifier means; a current amplifier having an input connected to the output of said amplifier means, said current amplifier having an output that is adapted to be connected to a Hall element to be energized by said current amplifier; a voltage divider circuit means having an output connected to said reference resistor, said voltage divider means being connected across said pair of DC voltage terminals for producing at said one amplifier-means input a bias voltage, which is dropped across said reference resistor, that is proportional to the DC supply voltage, said differential amplifier means being for varying the Hall energizing current from said current-amplifier output as a function of the temperature coefficient of said reference resistor to compensate for and stabilize the Hall sensitivity of the Hall element with respect to changes with temperature, and for changing the level of said Hall energizing current as a direct function of the DC supply voltage that may be applied to said DC voltage terminals.

2. The current source of claim 1 additionally comprising a sensing resistor, and wherein said current amplifier is a bipolar transistor connected in series with said sensing resistor, the base of said current amplifier transistor serving as said current amplifier input.

3. The current source of claim 2 wherein said current amplifier, said sensing resistor and said differential amplifier means together form a voltage follower means for making the voltage dropped by the Hall energizing current through said sensing resistor equal to the voltage across said reference resistor, said sensing resistor connected to serve as a collector resistor of said current amplifier transistor and to carry the Hall energizing current, the plus input of said differential amplifier means connected to the collector of said transistor, the minus input of said differential amplifier means serving as the input of said voltage follower means and being connected to said reference resistor for producing a Hall energizing current in said sensing resistor that is equal to the current in said reference resistor multiplied by the ratio of the resistances respectively of said reference resistor over said sensing resistor.

4. The current source of claim 3 wherein the ratio of the resistances respectively of said reference resistor and said output-current sensing resistor is equal to $I_H/I_{ref}$, where $I_H$ is the Hall energizing current and $I_{ref}$ is the current in said reference resistor so that an adjustment in the resistance value of either the reference resistor or the sensing resistor produces a corresponding adjustment in the magnitude of the Hall energizing current.

5. The current source of claim 4 wherein said reference resistor is a trimmable resistor for adjusting the Hall energizing current level.

6. The current source of claim 4 wherein said pair of voltage-divider resistors have mutually the same temperature coefficients of resistance.

7. A temperature-compensated current source for use in a Hall magnetic-field detector comprising a pair of DC voltage terminals to which a DC supply voltage may be connected for energizing said current source; a bipolar transistor, having an emitter serving as said current-source output to which a Hall element may be connected and from which a Hall-element energizing current may be provided; a Hall-energizing-current sensing resistor connected between one of said DC voltage terminals and the collector of said bipolar transistors; a voltage divider means connected across said DC voltage terminals comprised of a reference resistor, for producing across said reference resistor a voltage that is proportional to the DC supply voltage, a differential amplifier means having a plus input connected to the collector of said transistor and a minus input connected to said reference resistor for producing a voltage across said, sensing resistor that is equal to that across said reference resistor, and to effect a change in level of Hall energizing current proportionally with the DC energizing voltage.

8. The current source of claim 7 wherein said voltage divider means consists of a plurality of series connected resistors, including said reference resistor, connected across said DC voltage terminals.

9. The current source of claim 7 wherein said voltage divider means comprises first and second voltage divider resistors connected across said DC voltage terminals, a bipolar feedback transistor having a collector connected to one of said DC voltage terminals by said reference resistor, a feedback resistor connecting the emitter of said feedback transistor to the other of said DC voltage terminals, and a voltage follower circuit having an input connected to the junction between said first and second voltage divider resistors and having an output connected to said collector of said feedback transistor; so that the voltages at the input and at the output of said voltage follower circuit, and the current in said reference resistor, vary in proportion to the DC supply voltage.

10. The current source of claim 7 wherein said reference resistor and said sensing resistor have the same temperature coefficient of resistance.

11. A temperature-compensated current source for use in a Hall magnetic-field detector comprising a pair of DC voltage terminals to which a DC supply voltage may be connected for energizing said current source, a current-source output; an amplifier means for generating a Hall energizing current; a reference resistor connected to an input of said amplifier means; said amplifier means adapted for connection to a Hall element to be energized by said current source; a voltage divider circuit means having an output connected across said reference resistor, said voltage divider means being connected across said pair of DC voltage terminals for producing at said amplifier-means input a voltage that is proportional to the DC supply voltage, said amplifier means being for varying the Hall energizing current through said bipolar transistor as a function of the temperature coefficient of said reference resistor to compensate for and stabilize the Hall sensitivity of the Hall element with respect to changes in temperature, and for changing the level of said Hall energizing current from said current source output as a direct function of the DC supply voltage that may be applied to said DC voltage terminals.

12. A temperature-compensated current source for use in a Hall magnetic-field detector comprising a pair of DC voltage terminals to which a DC supply voltage may be connected for energizing said current source, a current-source output; an amplifier means for generating a Hall energizing current; a reference resistor connected to an input of said amplifier means; a bipolar transistor having a base connected to the output of said amplifier means, said bipolar transistor having an emitter connected to a Hall element to be energized by said bipolar transistor; a voltage divider circuit means having an output connected across said reference resistor, said voltage divider means being connected across said pair of DC voltage terminals for producing at said amplifier-means input a voltage that is proportional to the DC supply voltage, said amplifier means being for varying the Hall energizing current through said bipolar transistor as a function of the temperature coefficient of said reference resistor to compensate for and stabilize the Hall sensitivity of the Hall element with respect to changes in temperature, and for changing the level of said Hall energizing current from said current source output as a direct function of the DC supply voltage that may be applied to said DC voltage terminals.

* * * * *